United States Patent [19]
Kuwajima

[11] Patent Number: 5,534,461
[45] Date of Patent: Jul. 9, 1996

[54] METHOD FOR MANUFACTURING A SEMICONDUCTOR DEVICE HAVING PLANARIZED WIRING

[75] Inventor: Tetsuya Kuwajima, Hamamatsu, Japan

[73] Assignee: Yamaha Corporation, Japan

[21] Appl. No.: 397,616

[22] Filed: Mar. 2, 1995

[30] Foreign Application Priority Data

Mar. 4, 1994 [JP] Japan ..................................... 6-060221

[51] Int. Cl.⁶ .................................................. H01L 21/283
[52] U.S. Cl. ........................... 437/189; 437/192; 437/175
[58] Field of Search ..................................... 437/195, 189,
437/190, 192, 228 S, 228 PL, 228 T, 228 W,
187, 415 M; 257/750, 752, 758, 763

[56] References Cited

U.S. PATENT DOCUMENTS

| | | | |
|---|---|---|---|
| 4,847,673 | 7/1989 | Matsukawa | 257/752 |
| 4,876,223 | 10/1989 | Yoda et al. | 437/228 |
| 4,916,087 | 4/1990 | Tateoka et al. | 437/67 |
| 4,952,528 | 8/1990 | Abe et al. | 437/194 |
| 5,187,119 | 2/1993 | Cech et al. | 437/187 |
| 5,256,564 | 10/1993 | Narita | 437/195 |
| 5,266,446 | 11/1993 | Chang et al. | 430/314 |
| 5,266,526 | 11/1993 | Aoyama et al. | 437/195 |
| 5,385,867 | 1/1995 | Ueda et al. | 437/195 |
| 5,466,971 | 11/1995 | Higuchi | 257/751 |

FOREIGN PATENT DOCUMENTS 2-100341  4/1990  Japan .

OTHER PUBLICATIONS

Semiconductor World, Nov., 1990, pp. 216–219.

*Primary Examiner*—T. N. Quach

[57] ABSTRACT

A first contact hole and a second contact hole are formed in an insulating film on the surface of a substrate, and thereafter a blanket tungsten (W) layer is deposited on the substrate surface, with or without a barrier metal layer being interposed therebetween. The first contact hole has a small size a so that the W layer can fully bury the first contact hole, whereas the second contact hole has a large size b over a size c where a<c<b so that a desired wiring layer coverage ratio is attained. The deposited W layer is etched back while leaving the W layer in the first contact hole and a tapered W layer in the second contact hole. A wiring layer such as Al alloy is deposited on the substrate surface. The unnecessary wiring layer and barrier metal layer are patterned to form a wiring pattern. Wiring layers having a good burying state and a good coverage state can be obtained. A yield of manufacturing wiring layers can be improved.

25 Claims, 12 Drawing Sheets

METHOD FOR MANUFACTURING A SEMICONDUCTOR DEVICE HAVING PLANARIZED WIRING

BACKGROUND OF THE INVENTION a) Field of the Invention

The present invention relates to a semiconductor device and its manufacturing method, and more particularly to a semiconductor device having a planarized wiring layer and its manufacturing method.

b) Description of the Related Art

Planarizing technique is important for highly integrated semiconductor devices to maintain a good step coverage and a high precision of photolithography. Contact holes or via holes are formed in an insulating film overlying a semiconductor substrate or a wiring, and thereafter a wiring layer is formed on the insulating film to make electrical contacts with the underlying conductive regions through the contact holes or via holes. If contact holes or via holes can be fully filled with conductive material, a wiring layer formed thereon can be planarized. Known as a contact hole (via hole) burying technique are a selective growth technique of refractory metal and a combined technique of chemical vapor deposition (CVD, blanket deposition) and etch-back of a refractory metal layer.

The latter technique typically forms a tungsten (W) layer conformal to the topography of an underlying layer by CVD through reduction of $WF_6$ by silane and hydrogen. The W layer by CVD is grown also on the side wall of a contact hole. If the W layer is grown thicker than the radius of the contact hole, the contact hole is buried by the W layer growing from the side wall. The W layer grown on a flat surface outside of the contact hole is removed by etch-back technique. In this manner, the W layer can be left only in the contact hole.

The size of each contact hole for the source/drain regions of a MOS transistor formed on a semiconductor substrate is small because of a limited area of the source/drain regions, whereas the size of a contact hole for use in stabilizing the potential of a well is made sufficiently large so as to make a voltage drop negligible even if a large current is flowed. Contact holes having different diameters are therefore formed in an insulating layer. In this case, it takes a long time to bury a large contact hole by tungsten CVD. An unnecessarily thick W layer is therefore deposited on a flat surface and at a small contact hole. This burying technique is therefore impractical. Although the planarizing technique combining blanket growth and etch-back of W is particularly suitable for burying deep contact holes of a uniform and small diameter, it is difficult to bury a plurality of contact holes having different diameters.

SUMMARY OF THE INVENTION

It is an object of the present invention to provide a method for manufacturing a semiconductor device having a planarized wiring layer.

It is another object of the present invention to provide a method for manufacturing a semiconductor device having a wiring layer of good step coverage.

It is still another object of the present invention to provide a semiconductor device having a planarized wiring layer.

It is a further object of the present invention to provide a semiconductor device with planarized wiring patterns connected to a plurality of contact holes having different diameters.

According to one aspect of the present invention, there is provided a method for manufacturing a semiconductor device including the steps of: (a) providing a semiconductor substrate having a primary surface of a first level and a projection of a second level; (b) forming an insulating layer over the semiconductor substrate, the insulating layer having a topography including flat portions and a slope portion connecting adjacent flat portions, the topography transferring features of the primary surface and the projection; (c) forming a first contact hole and a second contact hole through the insulating layer, the contact hole having a side wall; (d) forming a first metal layer over the insulating layer; (e) forming a second metal layer over the first metal layer, the second metal layer being conformal to the first metal layer, wherein the second metal layer having a thickness of R on the flat portion and a thickness of Rs on the side wall; a collective thickness of the insulating layer and the first metal layer being defined as d, a coverage ratio of the side wall being defined as C=Rs/R; a preselected aspect ratio of a contact hole being defined as k, an aperture size r of the first and second contact holes being selected in a range of r≦2CR or r≧2CR+d/k; and (f) selectively removing the second metal layer so as to leave a second metal film on the side wall of the contact holes and to completely remove a second metal film on the flat and slope portions.

According to another aspect of the present invention, there is provided a method for manufacturing a semiconductor device including the steps of: (a) providing a semiconductor substrate having an overlying structure, a first interlayer insulating layer, and a first metal wiring thereon; (b) forming a second interlayer insulating layer over the semiconductor substrate, the second interlayer insulating layer having a topography including flat portions and a slope portion connecting adjacent flat portions and the topography transferring features of a topography of the overlying structure and the first metal wiring; (c) forming a first via hole and a second via hole having a larger aperture than the first via hole, through the second interlayer insulating layer; (d) conformally forming a first metal layer over the second interlayer insulating layer to fill the first and second via holes; and (e) selectively removing the first metal layer to leave a plug in the first via hole and a first metal film on a side wall of the second via hole and to completely remove a second metal film on the slope portion.

Contact holes are grouped into contact holes having smaller diameters which can be fully buried and contact holes having larger diameters which cannot be buried fully. The contact holes having smaller diameters are buried fully, and side wall conductive materials are left on the contact holes having larger diameters to improve step coverage. In this specification, a contact hole is meant to include a via hole, unless otherwise specified.

DETAILED DESCRIPTION OF THE PREFERRED EMBODIMENTS

FIGS. 1 to 6 illustrate the main processes of a semiconductor device manufacturing method according to the first embodiment of the invention.

Figure 1:
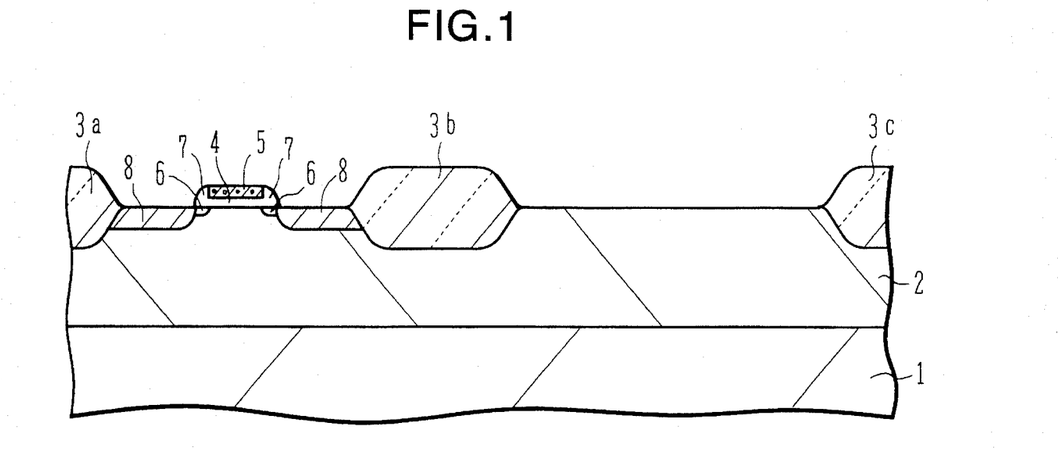
FIGS. 1 to 6 are cross sectional views of a semiconductor substrate illustrating the main process of a semiconductor device manufacturing method according to a first embodiment of the invention.

Referring to FIG. 1, in the surface region of an n⁻-type silicon substrate 1, a p⁻-type well 2 is being formed. On the surface of the p⁻-type well 2, field oxide films 3a, 3b, and 3e are selectively formed. The field oxide film is formed by local oxidation of silicon (LOCOS) by first forming a thin buffer oxide film on the surface of the semiconductor substrate, forming a nitride film pattern functioning as an oxidation mask and then oxidizing the substrate surface not covered by the mask. Oxidization of silicon accompanies volume increase and produces sloped step at the edge.

The field oxide films 3a, 3b, and 3e are shown separately in FIG. 1. They may be formed to be continuous.

The field oxide films 3a and 3b surround an active region in which a transistor is formed. A MOS transistor is formed in this active region. On the surface of the well 2, a thin gate oxide film is formed by thermal oxidation. On the gate oxide film, a polycrystalline silicon layer is formed. The polycrystalline silicon layer and gate oxide film are patterned to form a gate oxide film 4 and a polycrystalline silicon gate electrode 5.

A lightly doped drain (LDD) regions 6 are formed by implanting n-type impurity ions from the surface of the semiconductor substrate after an unnecessary area is covered with a resist pattern. Thereafter, this resist pattern is removed and a silicon oxide film is formed on the substrate surface by CVD. The silicon oxide film is anisotropically etched to form a side wall spacer oxide film 7 on the side walls of the gate electrode. An unnecessary area is again covered with a resist pattern, and n-type impurity ions are implanted into the active region to form n⁺-type source/drain regions 8. The LDD regions 6 under the side wall spacer oxide film 7 are prevented from being implanted, to remain in lightly doped state. After the resist pattern serving as the ion implanting mask is removed, the structure shown in FIG. 1 is obtained. The source/drain regions 8 of the MOS transistor formed in the above manner each have a width of about 1.8 µm in the cross section.

Figure 2:
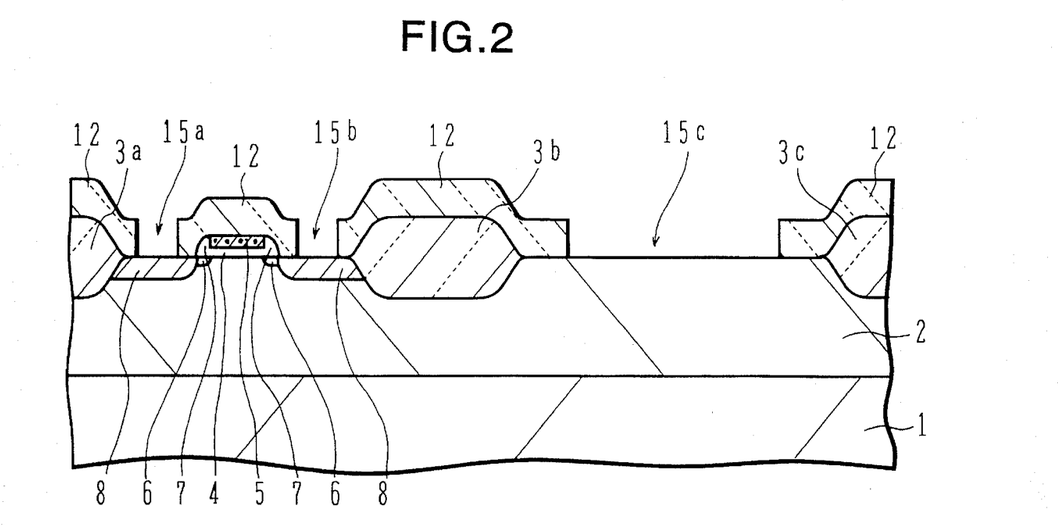

Referring to FIG. 2, an insulating film 12 of silicon oxide is deposited by CVD over the surface of the semiconductor substrate. Silane, disilane, and other materials may be used as silicon source materials, and $O_2$, $N_2O$, and other materials may be used as oxidizing agents. The insulating film 12 has a topography transferring the configuration of the underlying structure, e.g. slopes of field oxide layer and side wall spacers.

After the insulating film 12 is formed, a photoresist layer is coated over the surface of the semiconductor substrate to form a resist mask through exposure and development. By using this resist mask as an etching mask, the insulating film 12 is etched by reactive ion etching. In this manner, contact holes 15a and 15b for the source/drain regions 8 and a contact hole 15c for the well region 2 are formed in the insulating film 12. The width of each of the contact holes 15a and 15b for the source/drain regions 8 is, for example, about 0.8 µm with alignment tolerance of about 0.5 µm on both the ends of each of the source/drain regions 8.

The width of the contact hole 15c for the well region 2 is not determined from a contact resistance or the like, but is determined from the criterion to be described later.

Figure 3:
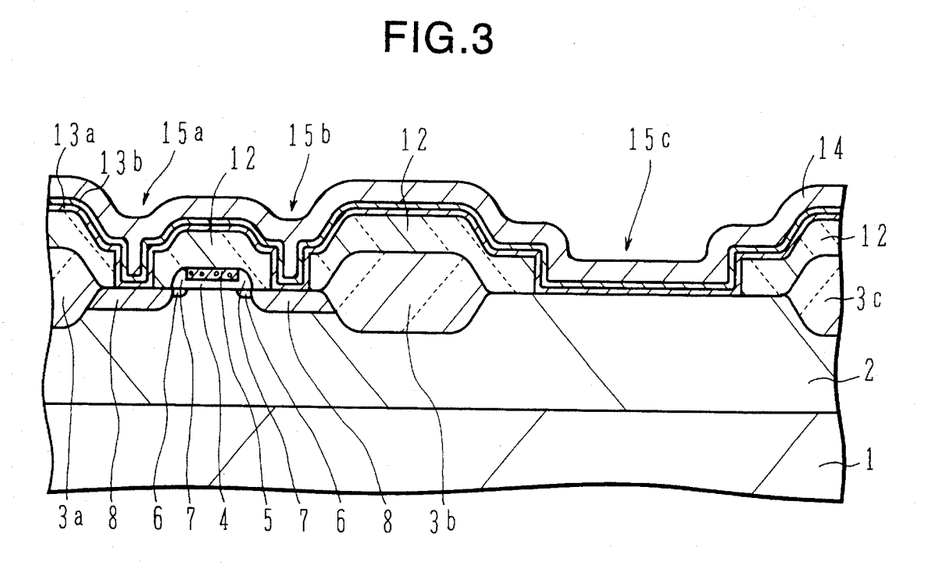

As shown in FIG. 3, a Ti layer 13a and a TiN layer 13b serving as barrier metal layers are deposited by sputtering over the surface of the semiconductor substrate.

Figure 7A:
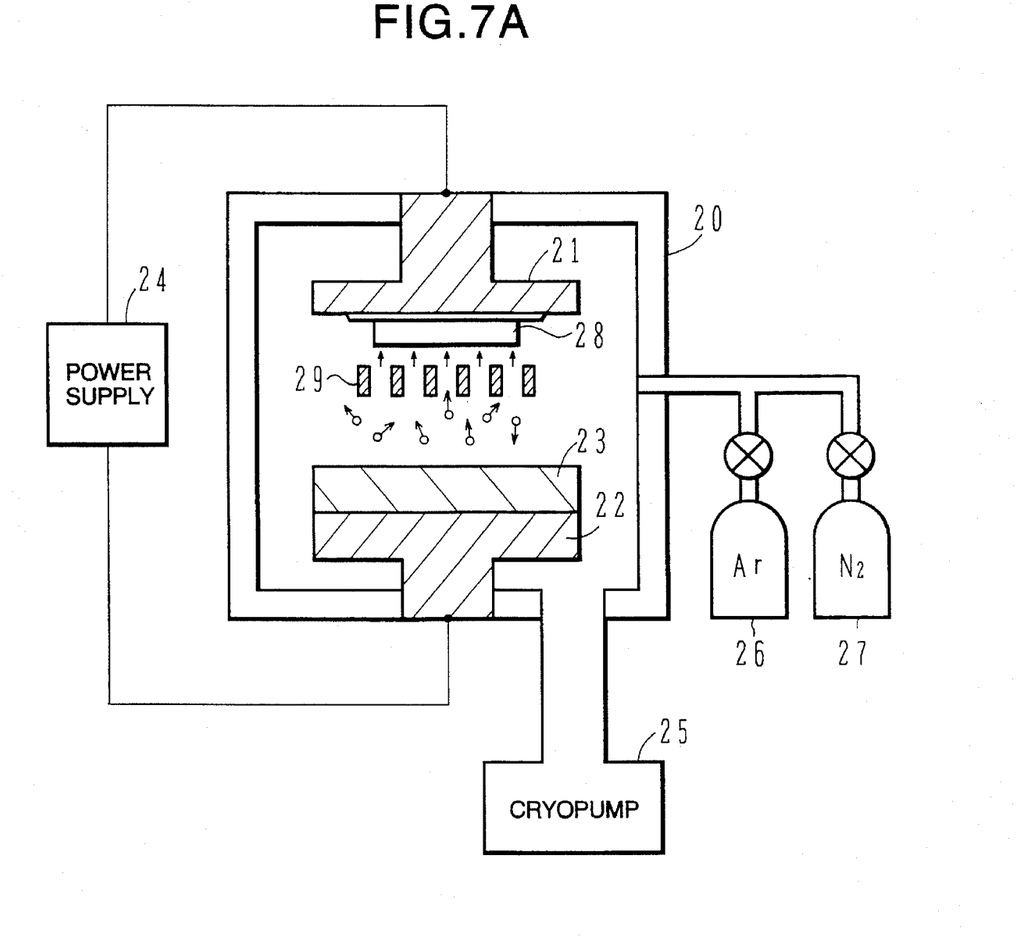
FIGS. 7A and 7B are a schematic cross sectional view of a sputtering system and a schematic perspective view of a filter used in the sputtering system.

FIGS. 7A and 7B are schematic diagrams showing the structure of a sputtering system. In the preferred embodiment, a collimate sputtering apparatus is used, however, it is not limited to the collimate sputtering apparatus. Parallel plate electrodes 21 and 22 are disposed facing each other in a vacuum chamber 20. A target 23 to be sputtered is placed on the lower electrode 22. A semiconductor substrate 28 to be deposited with a sputter film is disposed on the lower surface of the upper electrode 21 by a chuck. The electrodes 21 and 22 are connected to a radio frequency (RF) power source, for example, at 13.56 MHz. A gas supply pipe communicates with the vacuum chamber 20. A work (plasma) gas source 26 such as Ar and an $N_2$ gas source 27 to be used as a reactive gas for reactive sputtering are connected via valves to the gas supply pipe. An evacuation system 25 such as a cryopump is connected to the vacuum chamber 20.

A filter 29 for arranging the directions of incoming molecules uniformly is disposed near the substrate. The filter 29 and semiconductor substrate 28 are maintained at a floating potential.

Figure 7B:
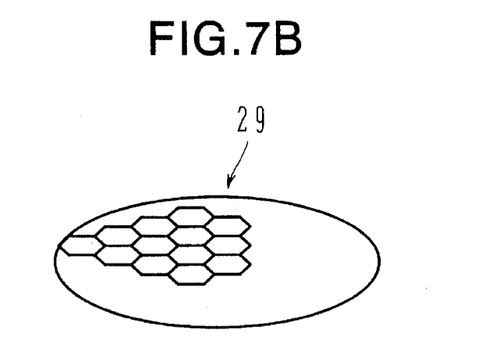

FIG. 7B is a schematic diagram showing the structure of the filter 29 having honeycomb openings. Only those molecules, atoms, and the like coming from the target 23 and passing through the openings reach the substrate 28.

In depositing a Ti sputter layer, Ti material is used as the target 23. The work gas Ar is introduced into the vacuum chamber 20 and a radio frequency power is supplied to generate plasma. Ti particles sputtered from the target 23 by Ar particles in the plasma pass through the filter 29 and deposited on the substrate 28.

In depositing a TiN sputter layer, a work Ar gas as well as a reactive $N_2$ gas is supplied. Ti atoms sputtered from the Ti target 23 react with $N_2$ or N in the vacuum chamber 20 and TiN is deposited on the substrate 28.

This sputtering uses the filter so that there is some directivity of sputtering (collimate sputtering). Therefore, the sputtered film is deposited thick on the bottom of a contact hole, and thin on the side wall thereof. The coverage ratio depends on an aspect ratio and topography of a hole on which the sputter film is deposited.

In depositing the Ti sputter layer 13a, the work gas, for example, Ar gas, is flowed at a flow rate of 80 sccm, at a pressure of 3 mTorr, at an RF power of 1 kW, and at a substrate temperature of 150° C.

In depositing the TiN sputter film 13b, the work gas, for example, Ar gas, is flowed at a flow rate of 40 sccm, and the reactive $N_2$ gas is flowed at a flow rate of 40 sccm, at a total pressure of 4 mTorr, at an RF power of 5 kW, and at a substrate temperature of 150° C.

Returning back to FIG. 3, after the barrier metal layers 13a and 13b are formed, a W layer 14 is deposited over the substrate surface by CVD. The thickness of the W layer 14 is selected so as to satisfy the criterion to be later described.

CVD of the W layer 14 is performed by flowing source gases $WF_6+H_2+$ Ar respectively at the flow rates of 100+500+2000 sccm, at a pressure of 50 Torr and at a substrate temperature of 450° C. The W layer grows also on the side walls of the contact holes 15a and 15b, and the inner spaces of the contact holes are gradually buried with the W layer. The W layer is grown until the inner spaces of the contact holes 15a and 15b are completely buried. During this growth, the W layer 14 grows also on the area other than the contact holes. The contact hole 15c for the well region 2 is large so that this hole 15c is not buried completely, but the W layer conformal to the topography of the underlying layer is deposited on the contact hole 15c.

Figure 4:
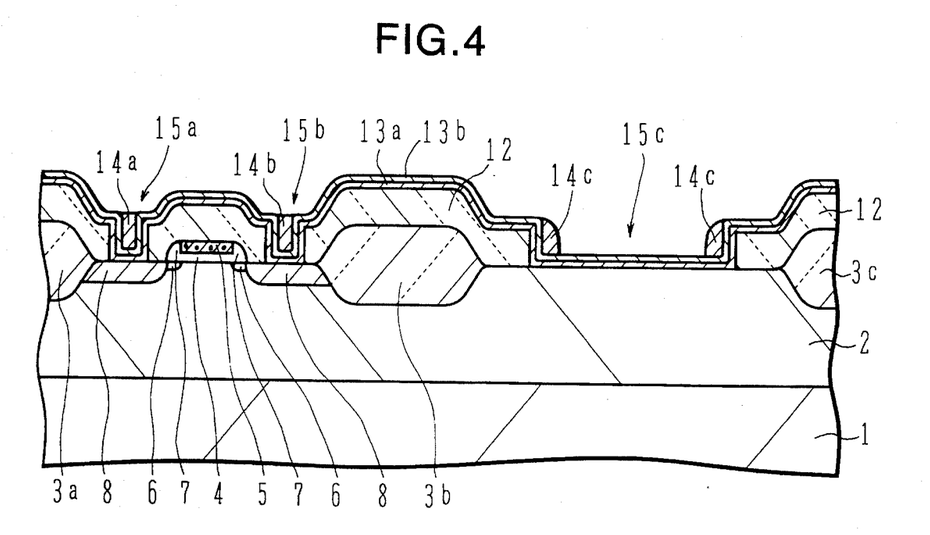

As shown in FIG. 4, the W film 14 having buried the contact holes 15a and 15b for the source/drain regions 8 of the MOS transistor is removed by etch-back technique. This etchback continues until the W film on the insulating film 12 near the contact holes 15a and 15b is completely etched. The etch-back is performed by flowing the etching gas, for example, $SF_6+Ar$, respectively at the flow rates of 100+100 sccm, at a pressure of 250 mTorr, at an RF power of 400 W, and at a substrate temperature of 25° C.

The surfaces of the contact holes 15a and 15b for the source/drain regions 8 are planarized leaving only W plugs 14a and 14b therein.

the contact hole 15c for the well region 2, the W layer is fully removed at the flat area by etching, and only a W region 14c is left on the side wall of the contact hole 15c. This is also the case for wide contact holes other than the well contact. This W region 14c left on the side wall has a tapered shape in section so that the step of the contact hole is substantially relieved.

Figure 5:
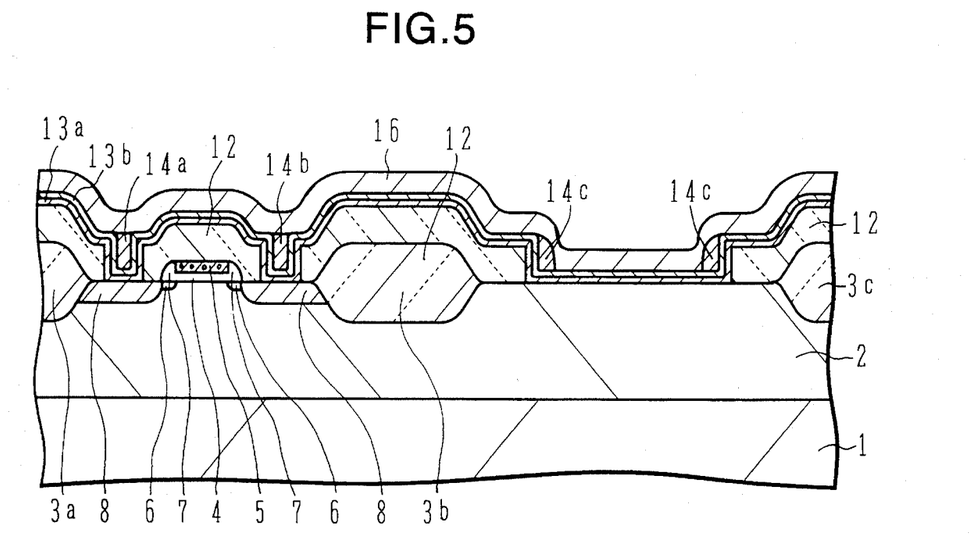

As shown in FIG. 5, on the surface of the semiconductor substrate formed with the W plugs, Al or Al alloy is sputtered to deposit a wiring layer 16.

A photoresist film is coated on the wiring layer, exposed and developed to leave a photoresist mask corresponding to a wiring pattern.

Figure 6:
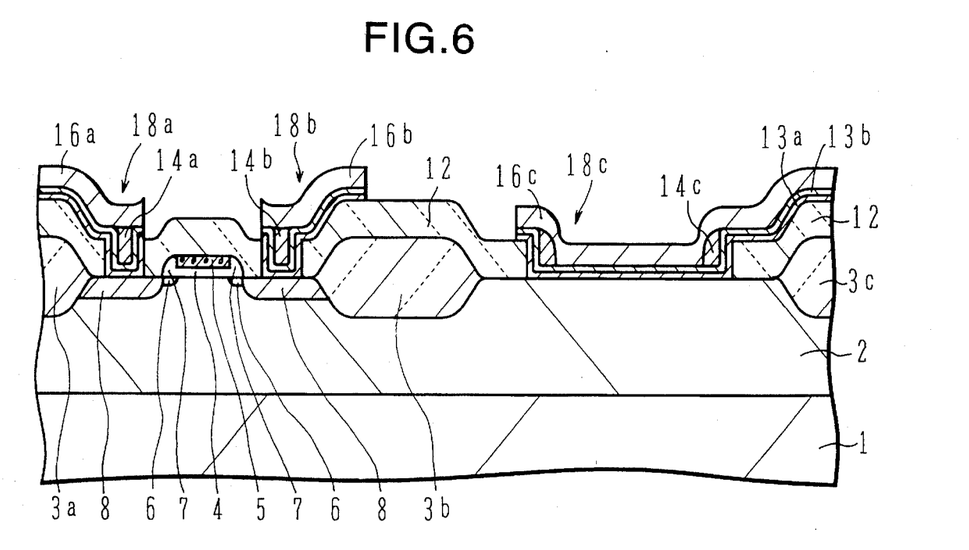

As shown in FIG. 6, by using the photoresist mask as an etching mask, the underlying wiring layer 16 and barrier metal layers 13b and 13a are anisotropically etched to form wiring patterns 18a, 18b, and 18c.

In the above description, a silicon oxide film is used as the insulating film 12. Instead of the silicon oxide film, phosphosilicate glass (PSG), borophosphosilicate glass (BPSG), or silicon oxide formed by tetraethoxysilane (TEOS) may also be used.

Next, the criterion of determining the sizes of the W layer 14 and contact holes will be explained.

Figure 8:
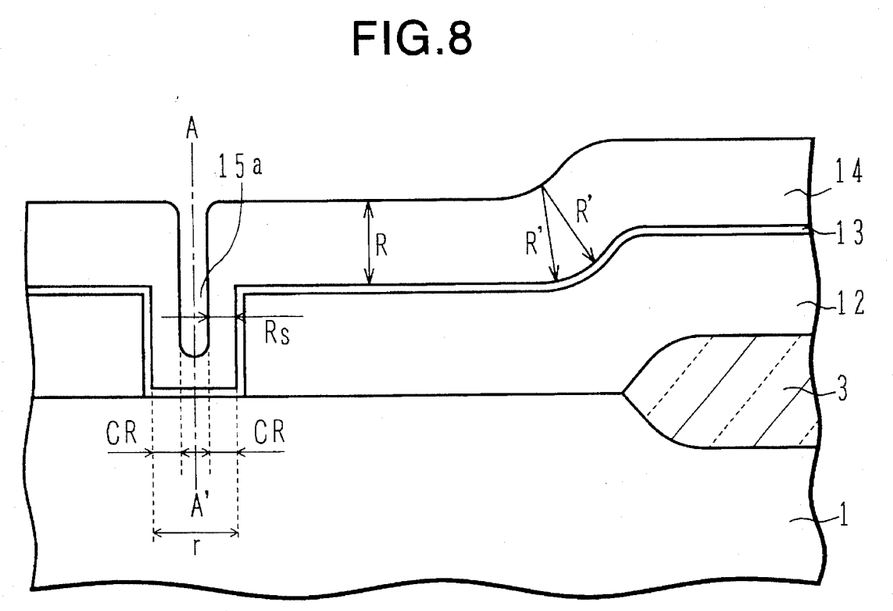
FIGS. 8 and 9 are schematic cross sectional views of a semiconductor substrate illustrating the relationship between the diameters of contact holes and the thicknesses of deposited wiring layers.

FIG. 8 illustrates the deposition state of the W film 14 in the small contact hole 15a. If the thickness R of the W film 14 is set larger than the radius R' of curvature at the step S of the insulating film 12, the film thickness at the step S becomes larger than R. Therefore, the W film 14 is likely to be left on the step S when it is etched back. The minimum radius R' of curvature among all steps of the insulating film 12 formed on the substrate (semiconductor chip) 1 is measured, and the film thickness R is set to be equal to or smaller than the minimum radius R' of curvature. With this film thickness R, it becomes easy to prevent the W film to be left on the substrate when it is etched back.

The side coverage ratio C (0<C<1) of the contact hole 15a is Rs/R, C=Rs/R where Rs is the thickness of the W film 14 on the side wall of the contact hole 15a. The W film 14 grows on the side wall of the contact hole 15a to a thickness of 2CR on both the sides of the center line A–A'. Therefore, a contact hole having a diameter larger than 2CR cannot be fully buried with a deposited film. The diameter r of a contact hole which can be buried with the W film deposited at the process shown in FIG. 8 is therefore given by the following formula (1):

$$r<2CR\leqq 2CR'  \qquad (1)$$

Figure 9:
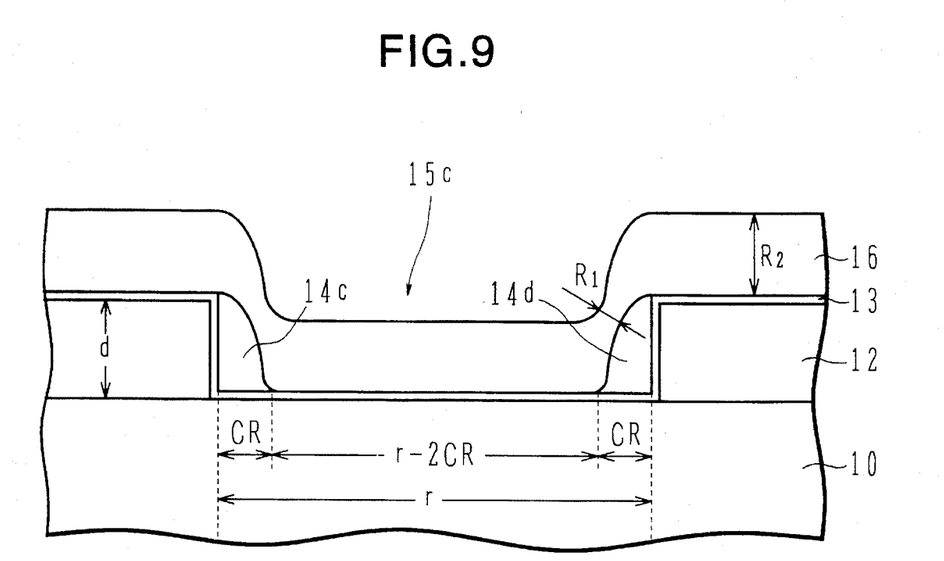

FIG. 9 illustrates the wiring formation state in the large contact hole 15c. In the figure, letters $R_1$ and $R_2$ represent thickness of the wiring layer 16 at the step portion and the flat portion, respectively. Even if the large contact hole is not fully buried, it is sufficient if the shape of the large contact hole after the etch-back allows the overlying wiring layer such as Al alloy to securely cover the contact hole. In other words, the aspect ratio k of the contact hole after etch-back of the deposition film is set sufficiently small so as to allow a good coverage of the contact hole by sputtering.

The aspect ratio k is therefore given by the following formula (2):

$$k\leqq k_o \qquad (2)$$

where $k_o$ is an aspect ratio which can obtain a desired minimum coverage ratio ($R_1/R_2$).

The aspect ratio k can be expressed by:

$$k=d/(r-2CR) \qquad (3)$$

where d is a thickness of the insulating film 12, r–2CR is the diameter of an opening of the contact hole 15c after the etch-back. By modifying the equation (3), we obtain the following formulas (4):

$$k_o\geqq d/(r-2CR)$$

$$r\geqq 2CR+d/k_o \qquad (4)$$

A good coverage ratio can be obtained by using a contact hole having the diameter r as defined by the formulas (4).

The diameter r not satisfying the formulas (1) and (4) is given by the following formula (5):

$$2CR<r<2CR+d/k_o \qquad (5)$$

Holes having the diameter in the range of the formula (5) are to be eliminated in order to obtain a good coverage ratio. In the formula (5), $k_o$ is generally in the order of 0.5, d is about 1.0 μm in the case of 0.5 μm-rule process although it changes with the generation of semiconductor fabrication techniques, and C is generally 0.9 or larger which is an expected target value.

The actual value r is obtained from the formula (5) in the following manner. First, the degree of flatness of the insulating film 12 is evaluated from radii of curvature. For example, the minimum radius R' of curvature is obtained by using a photograph or the like of the cross section where a chip has the greatest irregular surface. The thickness R of a W film to be deposited is determined not to exceed this minimum radius R' of curvature. If radii of curvature cannot be measured directly, the thickness may be determined by observing residue of a deposited and etched-back film. The thickness of the insulating film 12 is then measured. Lastly, the side coverage ratio C is determined from experiments.

For example, assuming that C=0.95, R=0.7 (μm), d=1.0 (μm) and $k_o$=0.5, the inhibition range is 1.33<r<3.33 (μm). Although C, d, and R depends on the device processes, $k_o$=0.5 may be considered to be a common value. Therefore, by substituting $k_o$=0.5 into the formula (5), we obtain the following formula (6):

$$2CR < r < 2CR + 2d (\mu m) \qquad (6)$$

If contact holes having the diameter in the range of the formula (6) are inhibited to be formed, a wiring layer having sufficient coverage can be obtained and a manufacturing yield of wiring layers can be improved. That is to say, a good wiring can be formed on the contact holes 15a and 15b because the holes are fully buried with deposited W, and a good step coverage wiring can be formed on the contact hole 15c by usual sputtering of Al alloy or the like.

As described above, the thickness of a conductive layer (tungsten layer) conformal to the topography of an insulating film having steps and formed on the substrate is set in a particular range in relation with contact holes of various sizes formed in the insulating film, at the process of burying the holes with the conductive layer. In other words, holes having a diameter in a particular range are not formed.

With such settings, when a conformal conductive layer (tungsten layer) deposited on an insulating film with contact holes is etched back, (1) the tungsten layer is not left on the insulating film at the step portion of the insulating film, (2) small contact holes are fully buried, and (3) tapers are formed by the tungsten layer left on the side walls of large contact holes.

Although the diameter of some holes becomes larger because holes having a diameter in the particular range are inhibited to be formed, it is possible to improve the step coverage of a wiring layer. The step coverage is further improved by the tapered tungsten layer left on the side walls of large contact holes.

The barrier metal layer is formed by sputtering. From the characteristic features of sputtering, the barrier metal layer is formed uniform and thick on the bottom of a contact hole, whereas it is formed thin on the side wall of the contact hole, particularly on the upper edge and its peripheral area. However, since the tapered tungsten layer is left, the conductive layer of tungsten formed on the thin barrier metal layer reinforce the latter.

Large contact holes for well contacts have been described above. However they are not limited to be used for well contacts. They may be applicable to active regions (source, drain, emitter, collector, etc.). Such large contact holes may be formed at the region where a large current flows, such as power supply lines, output ports, ground regions, or at the region where a low resistance is required for a high speed operation, such as contacts to a resistor ladder of a digital-to-analog converter (DAC).

Figure 10:
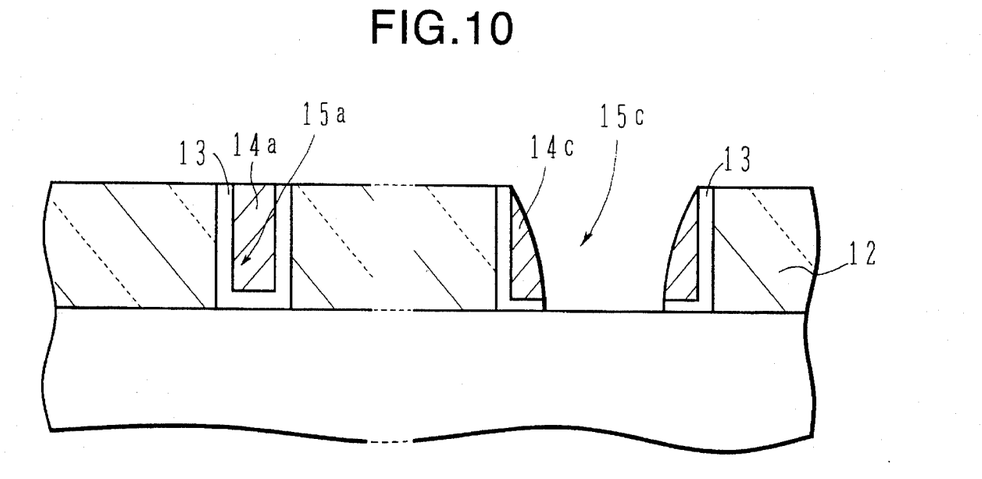
FIGS. 10 and 11 are schematic cross sectional views of a semiconductor substrate illustrating a semiconductor device manufacturing method according to a second embodiment of the invention.
Figure 11:
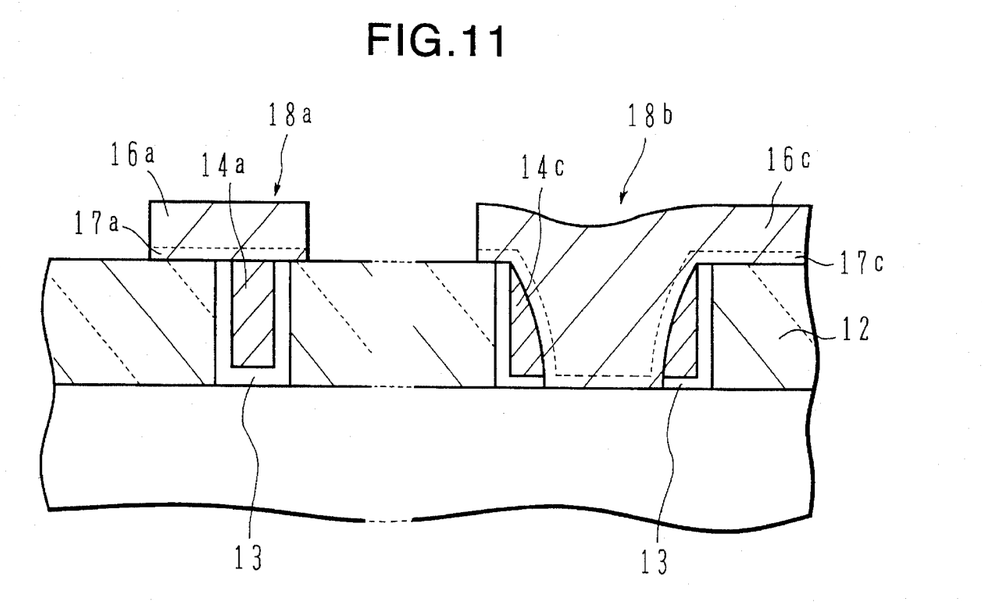

FIGS. 10 and 11 illustrate another embodiment of the invention. Like parts to those shown in FIGS. 1 to 6 are represented by using identical reference numbers and characters, and the detailed description thereof is omitted.

The process illustrated in FIG. 10 is an etch-back process following the process shown in FIG. 3. In this process, a W layer 14 and a conductive (barrier metal) layer 13 are etched back until the surface of an insulating film 12 is exposed. As a result, the W layer 14a and conductive layer 13 are left burying a contact hole 15a. Part 14c of the W layer 14 and part of the conductive layer 13 are left on the side wall of a contact hole 15c. The conductive layer 13 is partially removed.

In the process illustrated in FIG. 11, after a wiring film 17 such as TiN is formed, wiring material 16 such as Al and Al alloy is deposited over the substrate by sputtering. The deposited layer is patterned to form desired wiring patterns 18a and 18b.

The wiring film 17 such as TiN functions as a barrier metal film. Provision of wiring films 17a and 17c improves the reliability of wiring. The wiring film 17 may be omitted under some conditions.

FIGS. 12 to 20 illustrate main processes of a semiconductor device manufacturing method according to another embodiment of the invention.

Figure 12:
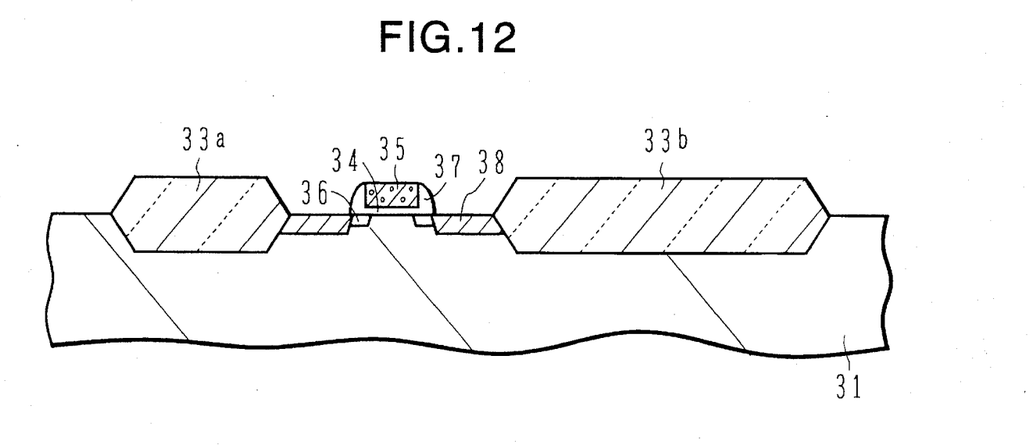
FIGS. 12 to 20 are schematic cross sectional views of a semiconductor substrate illustrating a semiconductor device manufacturing method according to a third embodiment of the invention.

As shown in FIG. 12, on the surface of a silicon substrate 31, a LOCOS oxide film is selectively formed to make field oxide films 33a and 33b. It is assumed as depicted in FIG. 12 that the width of the field oxide film 33a is relatively narrow and the width of the field oxide film 33b is relatively wide. AMOS transistor is formed in an active region surrounded by the field oxide films 33a and 33b. First, a gate oxide film 34 is formed by thermal oxidation on the surface of the substrate. A polycrystalline silicon layer 35 is deposited over the gate oxide film 34. The polycrystalline silicon layer 35 and gate oxide film 34 are patterned by photolithography to form an insulated gate electrode structure. By using the insulated gate electrode structure as a mask, ions are implanted to form LDD regions 86. Next, a silicon oxide film is deposited over the substrate surface by CVD, and anisotropically etched leaving side wall spacer oxide films 37. By using the side wall spacer oxide films 37 as a mask, ions are implanted to form source/drain regions 38 of a high impurity concentration. In this case, a resist pattern as an ion implantation mask is formed at the region where ions should not be implanted.

Figure 13:
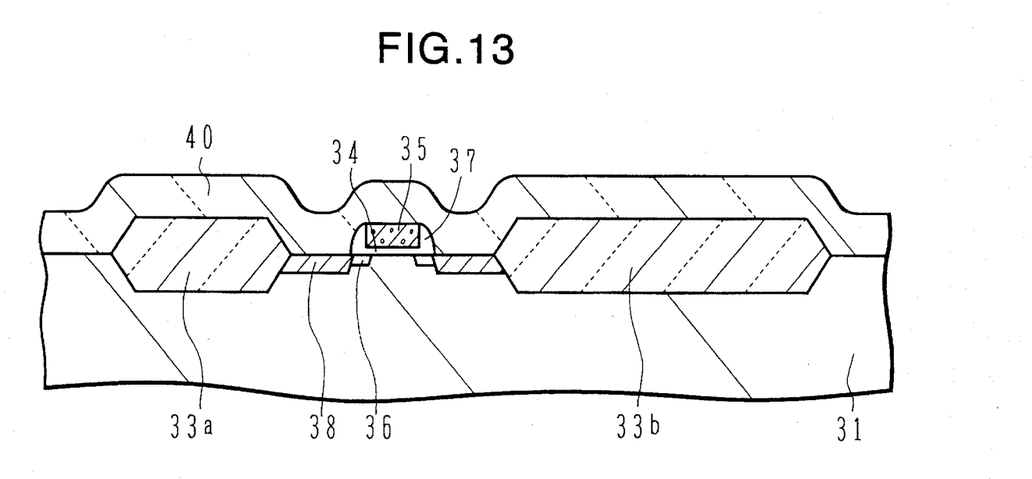

As shown in FIG. 13, an insulating layer 40 is deposited over the substrate surface, the insulating layer being made of an insulator such as SiO2, BPSG, PSG, and TEOS oxide film. Irregular surfaces conformal to the topography of the underlying layer are formed on the surface of the insulating film 40.

Figure 14:
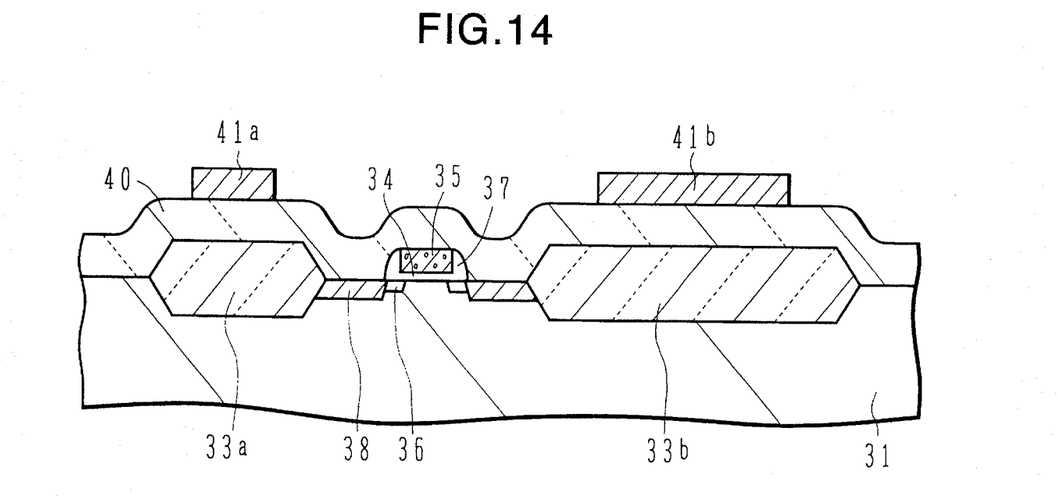

As shown in FIG. 14, a wiring layer such as Al and Al alloy is formed on the insulating layer 40 by sputtering, and patterned by photolithography to form first wirings 41a and 41b. The first wiring 41b is wider than the first wiring 41a.

Figure 15:
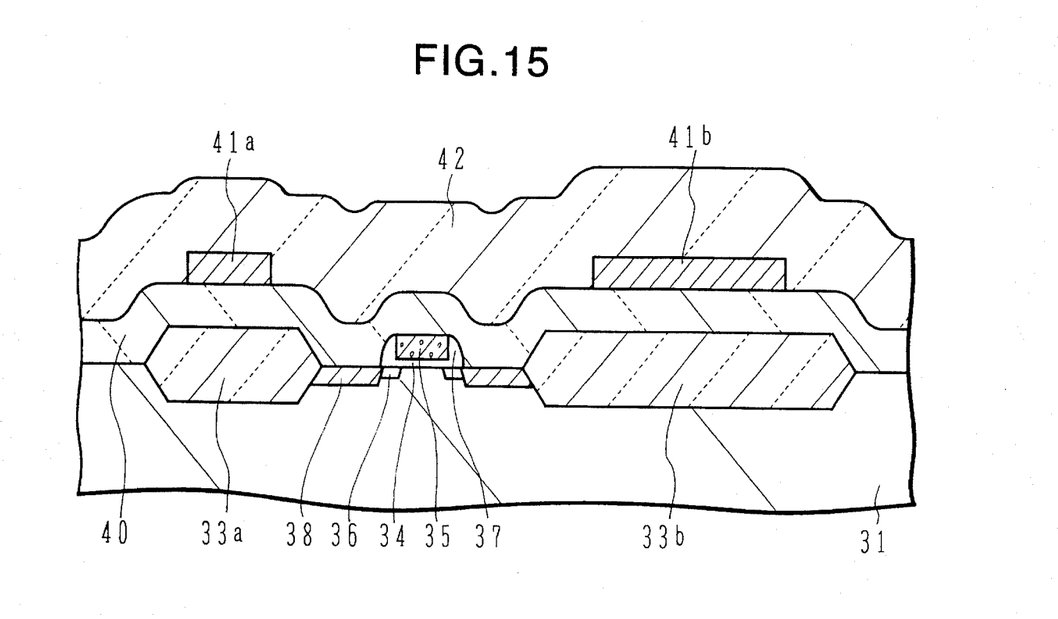

As shown in FIG. 15, an interlayer insulating film 42 such as $SiO_2$, PSG, BPSG, and TEOS oxide film is deposited by CVD over the substrate surface formed with the first wirings 41a and 4b. The interlayer insulating film 42 has a topography transferring the configuration of the underlying structure.

Figure 16:
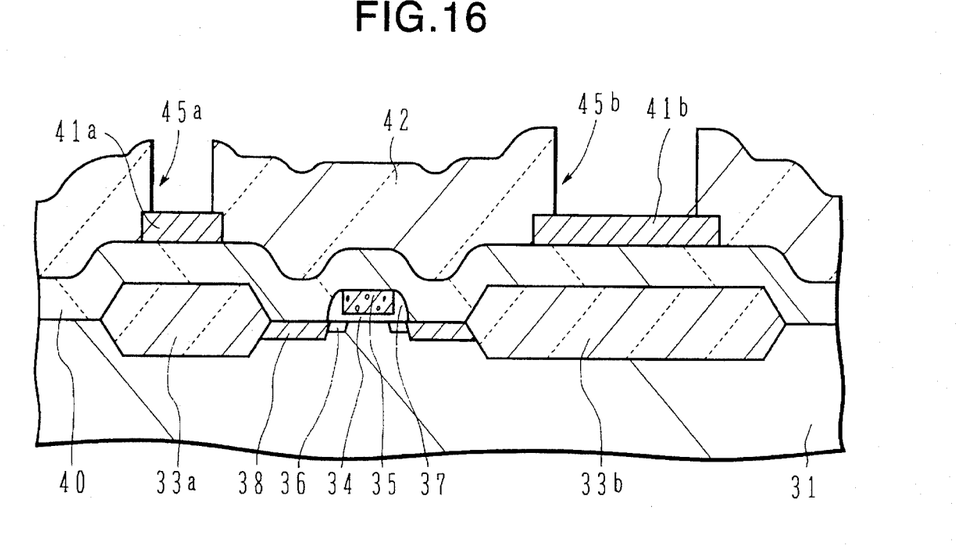

As shown in FIG. 16, a resist pattern is formed on the interlayer insulating film 42, and the interlayer insulating film 42 is anisotropically etched to form openings (contact holes) 45a and 45b which have different diameters matching the underlying wirings 41a and 41b. The sizes of the narrow and wide openings 45a and 45b are selected in accordance with the already discussed criterion so as to bury the narrow opening and expose the flat bottom and obtain a good coverage ratio in the board opening, after a wiring layer is formed.

Figure 17:
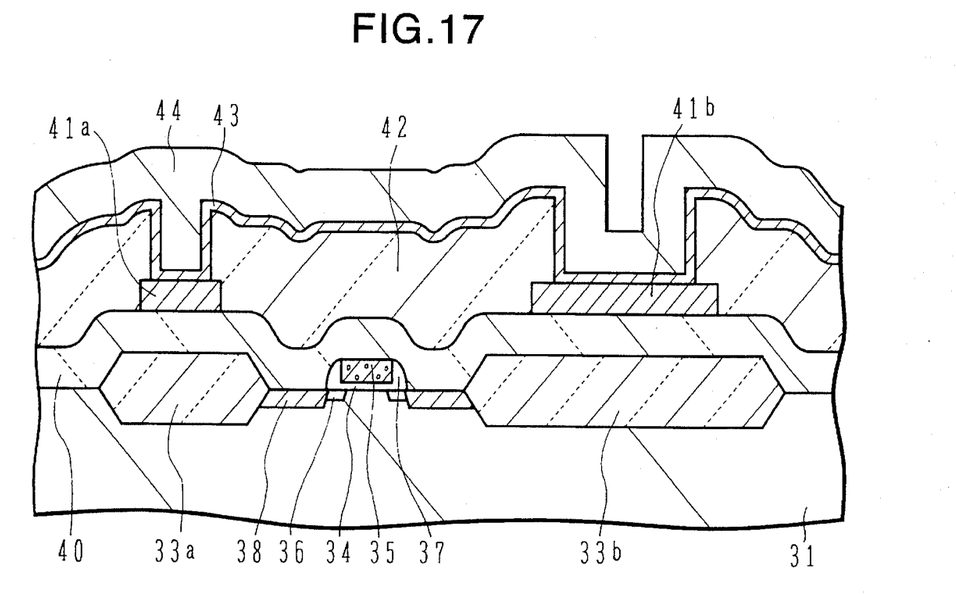

As shown in FIG. 17, a barrier metal layer 43 (such as Ti, TiN) is formed over the substrate surface having the openings 45a and 45b by sputtering. On the barrier metal 43, a W layer is conformally formed by CVD.

Figure 18:
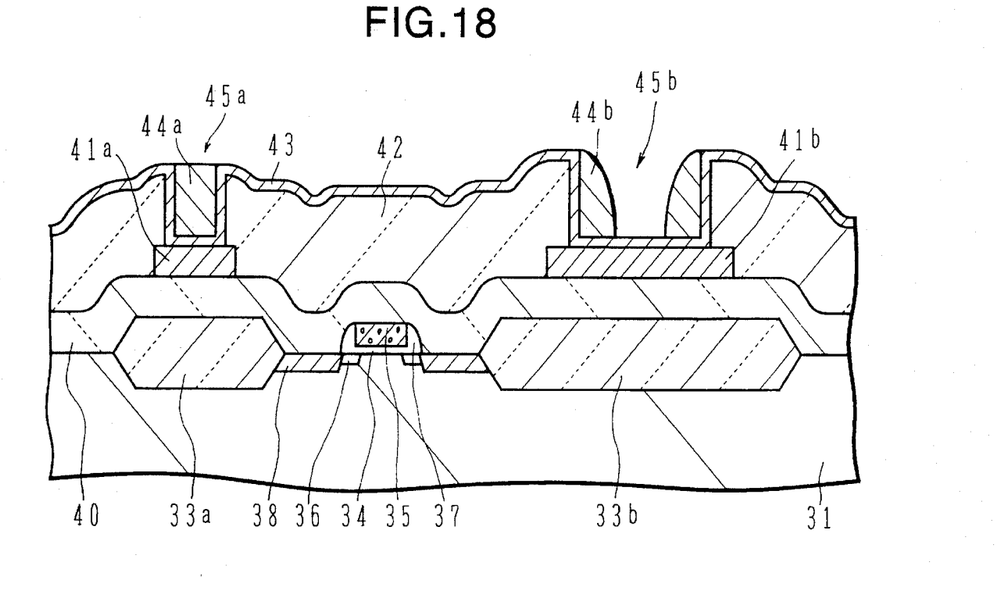

As shown in FIG. 18, the W layer 44 is etched back so that the W layer in the contact hole 45a is left to form a W plug 44a. In the larger diameter contact hole 45b, the W layer on the flat surface is removed and only a side wall W region 44b is left on the side wall of the contact hole 45b. The side wall W region 44b has a tapered surface as shown in the figure.

Figure 19:
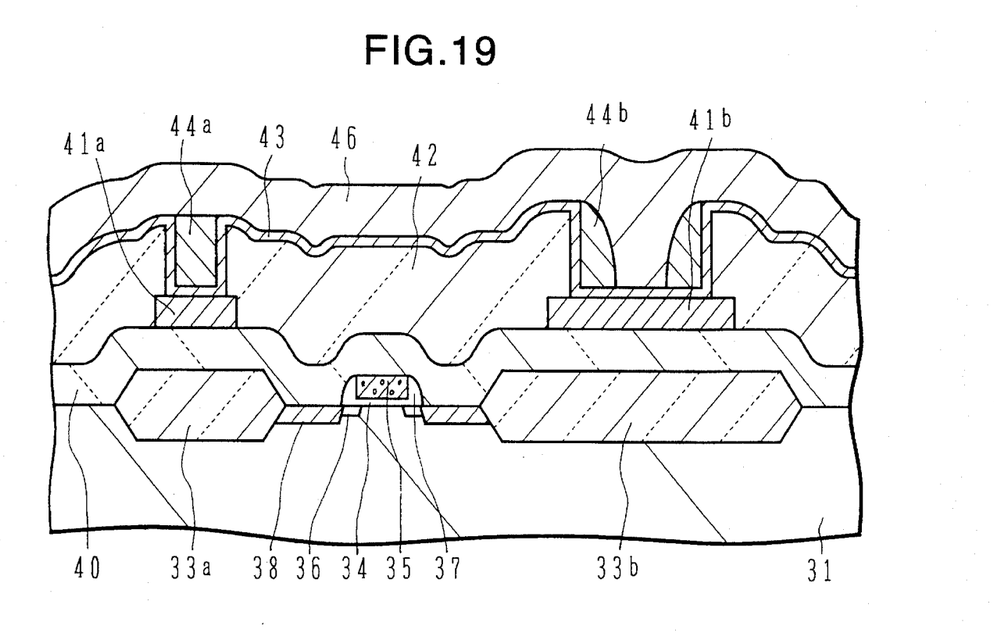

As shown in FIG. 19, a wiring layer 46 is formed by sputtering on the substrate surface with the W plug 44a. The wiring layer 46 is made of Al, Al alloy such as Al—Si and Al—Si—Cu, or the like.

Figure 20:
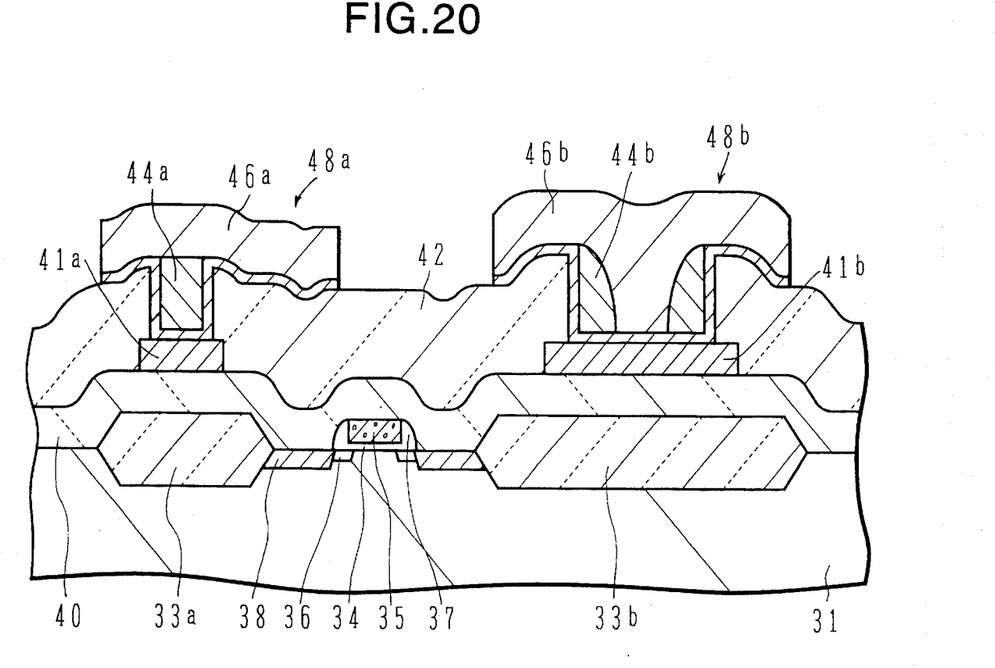

As shown in FIG. 20, the wiring layer 46 and barrier metal layer 43 are patterned to form wiring layers 48a and 48b. Wiring layers 48a and 48b may be a continuous interconnection wiring, as shown by a broken line.

Similar to the wiring layers connected at the substrate surface, the overlying wiring layer has also good contacts and a planarized surface.

The present invention has been described in connection with the preferred embodiments. The invention is not limited only to the above embodiments. For example, semiconductor other than Si semiconductor may be used. Conductive materials, for example, Al and Mo may be used instead of W. Barrier metal may be selected from the group consisting of Ti, TiN TiW, TiON and combinations thereof. A semiconductor substrate with or without wells may be used. Semiconductor elements other than MOS transistors may be formed. It is apparent to those skilled in the art that various modifications, substitutions, improvements, combinations and the like can be made without departing from the scope of the appended claims.

I claim:

1. A method for manufacturing a semiconductor device comprising the steps of:
  (a) providing a semiconductor substrate having a primary surface of a first level and a projection of a second level;
  (b) forming an insulating layer over the semiconductor substrate, the insulating layer having a topography including flat portions and a slope portion connecting adjacent flat portions, the topography transferring features of the primary surface and the projection;
  (c) forming a first contact hole and a second contact hole through the insulating layer, the contact hole having a side wall;
  (d) forming a first metal layer over the insulating layer;
  (e) forming a second metal layer over the first metal layer, the second metal layer being conformal to a surface of the first metal layer, wherein the second metal layer having a thickness of R on the flat portion and a thickness of Rs on the side wall; a thickness of the insulating layer being defined as d, a coverage ratio of the side wall being defined as $C=Rs/R$; a preselected aspect ratio of a contact hole being defined as $k_o$, an aperture size r of the first and second contact holes being selected in a range of $r \leq 2CR$ and $r \geq 2CR+d/k_o$, respectively; and
  (f) selectively removing the second metal layer so as to bury the first contact hole and to leave a second metal film on the side wall of the second contact hole and to completely remove a second metal film on the flat and slope portions.

2. A method according to claim 1, further comprising the steps of:
  (g) forming a third metal layer over the first and second metal films; and
  (h) patterning the third metal layer to form a second metal wiring.

3. A method according to claim 2, wherein the third metal layer comprises a material selected from a group consisting of aluminum and aluminum alloy.

4. A method according to claim 1, wherein the projection of the semiconductor substrate includes an isolation region and the topography of the insulating layer transfers a topography of the isolation region.

5. A method according to claim 1, wherein the insulating layer comprises a material selected from a group consisting of borophosphosilicate glass (BPSG), phosphosilicate glass (PSG), and silicon oxide formed by tetraethoxysilane (TEOS).

6. A method according to claim 1, wherein the first metal layer comprises a material selected from a group consisting of Ti, TiN, TiON, TiW and combinations thereof.

7. A method according to claim 1, wherein the second metal layer comprising tungsten (W).

8. A method according to claim 7, wherein in the step (e), the second metal layer of tungsten is deposited by chemical vapor deposition technique.

9. A method according to claim 7, wherein the second metal layer left in the second contact hole has a tapered topography.

10. A method according to claim 1, wherein the slope portion of the insulating layer has a minimum radius R' of curvature, and the thickness R of the second metal layer is selected to be $R<R'$.

11. A method for manufacturing a semiconductor device comprising the steps of:
  (a) providing a semiconductor substrate having an overlying structure, a first interlayer insulating layer, and a first metal wiring thereon;
  (b) forming a second interlayer insulating layer over the semiconductor substrate, the second interlayer insulating layer having a topography including flat portions and a slope portion connecting adjacent flat portions and the topography transferring features of a topography of the overlying structure and the first metal wiring;
  (c) forming a first via hole and a second via hole having a larger aperture than the first via hole, through the second interlayer insulating layer;
  (d) conformally forming a first metal layer over the second interlayer insulating layer to fill the first via hole and to cover the second via hole; and
  (e) selectively removing the first metal layer to leave a plug in the first via hole and a first metal film on a side wall of the second via hole and to completely remove a second metal film on the slope portion of the second interlayer insulating film.

12. A method according to claim 11, further comprising the step of:
  (c-1) following the step (c), forming a second metal layer over the second interlayer insulating layer.

13. A method according to claim 12, wherein the first metal layer has a thickness of R on the flat portion and a thickness of Rs on the side wall, a thickness of the first interlayer insulating layer is defined as d, a coverage ratio on the side wall is defined as $C=Rs/R$, a selected aspect ratio of a via hole is defined as $k_o$, wherein an aperture size r of the first and second via holes is selected in a range of $r \leq 2CR$ and $r \geq 2CR+d/k_o$ respectively.

14. A method according to claim 12, further comprising the steps of:
  (g) forming a third metal layer over the first and the second metal layers; and
  (h) patterning the third metal layer to form a second metal wiring.

15. A method according to claim 14, wherein the third metal layer comprises a material selected from a group consisting of aluminum and aluminum alloy.

16. A method according to claim 12, wherein the second metal layer comprises a material selected from a group consisting of Ti, TiN, TiON, TiW and combinations thereof.

17. A method according to claim 16, wherein the first metal layer is made of tungsten, and is deposited by chemical vapor deposition technique.

18. A method according to claim 11, wherein, the overlying structure of the semiconductor substrate comprises an isolation region and a gate electrode.

19. A method according to claim 11, wherein the first interlayer insulating layer comprises a material selected from a group consisting of borophosphosilicate glass (BPSG), phosphosilicate glass (PSG), and silicon oxide formed by tetraethoxysilane (TEOS).

20. A method according to claim 11, wherein the first metal layer comprises tungsten (W).

21. A method according to claim 11, wherein the first metal layer left in the second via hole has a tapered topography.

22. A method for forming a wiring, comprising the steps of:
   (a) forming first and second contact holes in an insulating film formed on a surface of a substrate, at the areas corresponding to first and second contact regions of the substrate;
   (b) non-selectively depositing refractory metal over the insulating film having the first and second contact holes to form a metal film;
   (c) etching back the refractory metal film while leaving the metal film in the first contact hole and while leaving part of the metal film on a side wall of the second contact hole;
   (d) depositing a wiring layer on a surface of the substrate covering the first and second contact holes; and
   (e) patterning the wiring layer and forming wiring pattern or patterns connected to the first and second contact regions.

23. A method according to claim 22, wherein at the step (a), the first contact hole having a small size a is formed so that the first hole is fully buried with the metal film having a sufficient thickness at the step (b), and the second contact hole having a large size b is formed so that the wiring layer formed at the step (d) has a desired coverage ratio, where a is smaller than twice a thickness of the wiring layer on a side surface of the contact hole and b is equal to or larger than the sum of twice a thickness of the wiring layer on a side surface of the contact hole and a quotient of thickness of the insulating film divided by a maximum aspect ratio of the second contact hole for providing a sufficient coverage.

24. A method according to claim 23, wherein said maximum aspect ratio is about 0.5.

25. A method according to claim 23, wherein the thickness of the metal film is set equal to, or smaller than, a minimum radius of curvature at steps on the insulating film formed on the substrate surface.

* * * * *